(12) United States Patent
Joshi et al.

(10) Patent No.: US 7,723,242 B2
(45) Date of Patent: May 25, 2010

(54) ENHANCED THIN-FILM OXIDATION PROCESS

(75) Inventors: Pooran Chandra Joshi, Vancouver, WA (US); Apostolos T. Voutsas, Portland, OR (US); John W. Hartzell, Camas, WA (US)

(73) Assignee: Sharp Laboratories of America, inc., Camas, WA (US)

( * ) Notice: Subject to any disclaimer, the term of this patent is extended or adjusted under 35 U.S.C. 154(b) by 980 days.

(21) Appl. No.: 11/327,612

(22) Filed: Jan. 6, 2006

(65) Prior Publication Data

US 2006/0110939 A1 May 25, 2006

Related U.S. Application Data

(63) Continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,377, filed on Mar. 15, 2004, now Pat. No. 7,122,487, and a continuation-in-part of application No. 10/801,374, filed on Mar. 15, 2004, now Pat. No. 7,087,537, and a continuation-in-part of application No. 10/831,424, filed on Apr. 23, 2004, now Pat. No. 6,995,053.

(51) Int. Cl.
*H01L 21/469* (2006.01)

(52) U.S. Cl. ........................ 438/778; 438/216; 438/591; 438/3; 438/758; 438/66; 438/487; 438/486; 257/410; 257/411; 257/506

(58) Field of Classification Search ................. 438/770, 438/771, 775, 776, 778, 787, 798, FOR. 395
See application file for complete search history.

(56) References Cited

U.S. PATENT DOCUMENTS

| 6,057,031 | A  | * | 5/2000 | Breme et al. ................ 428/336 |
| 6,096,656 | A  | * | 8/2000 | Matzke et al. ............... 438/702 |
| 6,139,702 | A  | * | 10/2000 | Yang et al. ............. 204/192.37 |
| 6,162,305 | A  | * | 12/2000 | Hsiao et al. ................. 148/280 |
| 6,482,704 | B1 | * | 11/2002 | Amano et al. ............... 438/285 |
| 6,503,810 | B2 |   | 1/2003 | Lee ........................... 438/396 |
| 6,614,977 | B2 | * | 9/2003 | Johnson et al. ............. 385/129 |
| 6,713,343 | B2 |   | 3/2004 | Sugawara et al. ........... 438/239 |
| 6,806,183 | B2 |   | 10/2004 | Kang et al. ................. 628/637 |

(Continued)

*Primary Examiner*—Fernando L Toledo
*Assistant Examiner*—Ankush k Singal
(74) *Attorney, Agent, or Firm*—Law Office of Gerald Maliszewski; Gerald Maliszewski

(57) ABSTRACT

A method is provided for additionally oxidizing a thin-film oxide. The method includes: providing a substrate; depositing an MyOx (M oxide) layer overlying the substrate, where M is a solid element having an oxidation state in a range of +2 to +5; treating the MyOx layer to a high density plasma (HDP) source; and, forming an MyOk layer in response to the HDP source, where k>x. In one aspect, the method further includes decreasing the concentration of oxide charge in response to forming the MyOk layer. In another aspect, the MyOx layer is deposited with an impurity N, and the method further includes creating volatile N oxides in response to forming the MyOk layer. For example, the impurity N may be carbon and the method creates a volatile carbon oxide.

11 Claims, 7 Drawing Sheets

U.S. PATENT DOCUMENTS

| | | |
|---|---|---|
| 6,841,436 B2 | 1/2005 | Hisada et al. .............. 438/197 |
| 7,067,439 B2* | 6/2006 | Metzner et al. ............ 438/785 |
| 2003/0210880 A1* | 11/2003 | Johnson et al. ............ 385/129 |
| 2004/0026371 A1* | 2/2004 | Nguyen et al. ............... 216/67 |
| 2004/0149963 A1* | 8/2004 | Sinko et al. ................ 252/500 |
| 2004/0209468 A1* | 10/2004 | Kumar et al. .............. 438/689 |
| 2005/0136556 A1* | 6/2005 | Matsuura et al. .............. 438/3 |
| 2005/0136586 A1* | 6/2005 | Ono .......................... 438/216 |
| 2005/0168552 A1* | 8/2005 | Arita et al. .................. 347/100 |
| 2005/0215066 A1* | 9/2005 | Joshi et al. ................. 438/758 |
| 2006/0008957 A1* | 1/2006 | Kwon et al. ............... 438/166 |
| 2006/0113628 A1* | 6/2006 | Idani et al. .................. 257/506 |

* cited by examiner

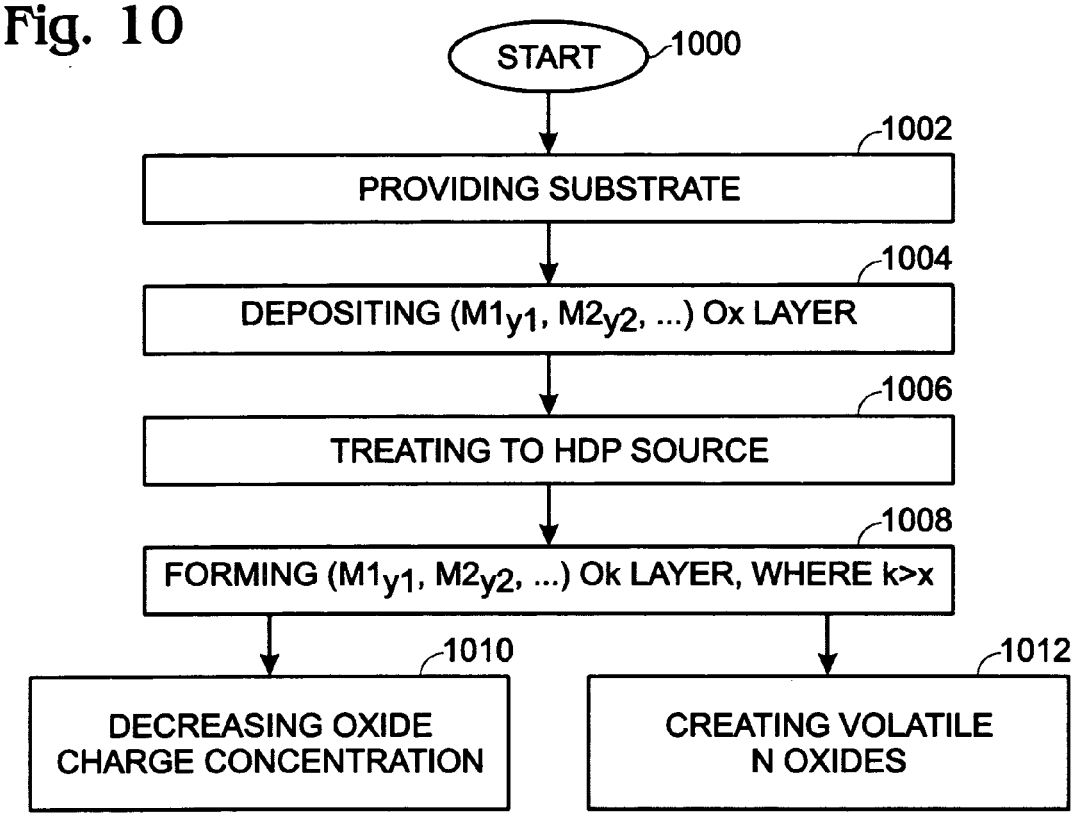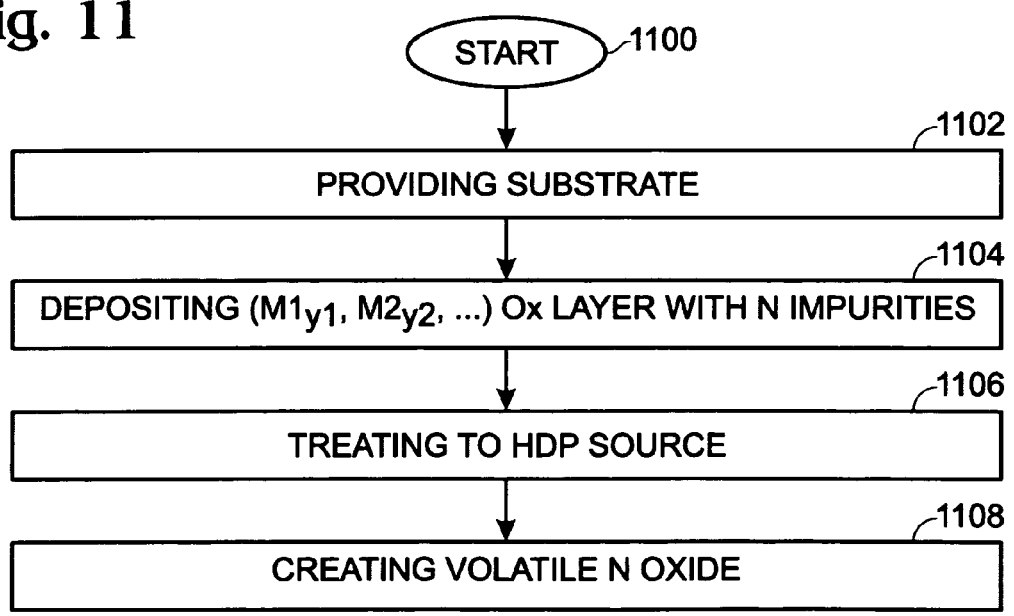

ENHANCED THIN-FILM OXIDATION PROCESS

RELATED APPLICATIONS

This application is a continuation-in-part of a patent application entitled, DEPOSITION OXIDE WITH IMPROVED OXYGEN BONDING, invented by Pooran Joshi, Ser. No. 10/801,377, filed Mar. 15, 2004 now U.S. Pat. No. 7,122,487.

This application is a continuation-in-part of a patent application entitled, HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595.

This application is a continuation-in-part of a patent application entitled, HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663.

This application is a continuation-in-part of a patent application entitled, METHOD FOR FABRICATING OXIDE THIN-FILMS, invented by Joshi et al., Ser. No. 10/801,374, filed Mar. 15, 2004 now U.S. Pat. No. 7,087,537.

This application is a continuation-in-part of a patent application entitled, VERTICAL THIN-FILM TRANSISTOR, invented by Schuele et al., Ser. No. 10/831,424, filed Apr. 23, 2004 now U.S. Pat. No. 6,995,053. All of the above-mentioned applications are incorporated herein by reference.

BACKGROUND OF THE INVENTION

1. Field of the Invention

This invention generally relates to the fabrication of integrated circuit (IC) devices, and more particularly, to a method for additionally oxidizing an oxide film using a high-density plasma oxidation process.

2. Description of the Related Art

The quality of polysilicon thin-films and the interface between silicon and silicon dioxide ($Si/SiO_2$) layers are critical to the performance of thin-film transistors, MOS capacitors, and various ICs. The quality of the $SiO_2/Si$ interface is dependent upon the quality of the $SiO_x$ (where x is less than, or equal to 2) transition layer at the interface and the defects in the poly-Si layer. The general approach is to improve the quality of the $SiO_x$ transition layer at the $Si/SiO_2$ interface. Defects in the poly-Si can also be passivated and the stoichiometry improved by oxidation and hydrogenation processes. These same issues also apply to semiconductor processes that form other types of oxide thin-films.

Although lower temperatures are generally desirable for any device fabrication process, they are especially critical in LCD manufacture, where large-scale devices are formed on a transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

Various semiconductor devices require the deposition of $SiO_2$, or other oxide thin-films, on structures that are both planar and non-planar. For planar surfaces there is usually no problem in depositing uniform $SiO_2$ thin-films over large areas in the fabrication of stable and reliable devices. However, for a device with vertical steps in the structure, such as shallow-trench isolation (STI), vertical thin-film transistors (V-TFTs), graded steps, or curved surfaces, it is important to deposit $SiO_2$ films with sufficient step-coverage to maintain film integrity, device performance, and yield. Thermal oxide has proven to be the most suitable oxide from the step-coverage point of view. However, the low growth rates and high processing temperatures exceeding 800° C. make thermal oxidation unsuitable for low-temperature devices.

Plasma-enhanced chemical vapor deposition (PECVD) processes are suitable for the low temperature processing of the $SiO_2$ thin-films. The electrical quality and the step-coverage of the PECVD deposited oxide thin-film are strongly dependent upon the processing conditions. It is possible to improve the step-coverage of the deposited oxide by decreasing the process temperature or varying the process chemistries and plasma process variables. However, any such attempt to improve the step-coverage results in a corresponding decrease in the oxide quality.

Generally, a fixed oxide charge is a positive charge that remains, after annealing out interface trap charges, and is caused as a result of a structural defect. These fixed oxide charges occur primarily within 2 nanometers of a Si/SiO2 interface. The charge density is dependent upon oxidation and hydrogenation processes. It is known that these fixed oxide charges can be minimized through the use of high oxidation temperatures. Fixed oxide charges in a gate oxide layer can act to degrade the threshold voltage of a transistor.

Oxide trapped charges can be formed at the interface between a silicon layer and a metal or Si substrate, or can be introduced throughout the oxide layer as a result of ion implantation. Mobile ionic charges can also be formed at the silicon oxide interface as a result of ionized alkali metals, sodium, or potassium. A gate insulator with any of the above-mentioned oxide charge types can degrade the threshold voltage, breakdown voltage, and current gain of a transistor.

There are two important factors that dictate the quality of the oxide thin films: Oxygen vacancies and impurities. Oxygen vacancies and impurities result in poorer electrical performance, stability, and reliability. There are various sources for the impurities in thin oxide films, such as the substrate material, deposition method, fabrication technique and setup, precursor composition and purity, device processing methods/steps, to name a few. One common impurity in thin oxide films is carbon (C), which can be induced by the system or process. C impurities can also come from the substrate, in the case of SiC-based devices. It is important to reduce the level of C or other impurities in thin films to fabricate reliable electronic devices.

The issue of incomplete oxidation can be addressed by exposing the films to oxygen atmosphere, while the carbon type impurities can be effectively removed by conversion of the C to CO or $CO_2$, which diffuses out of the film. One common approach to improve oxidation and minimize the C type impurities in oxide thin films is a post-deposition treatment in an oxygen atmosphere. However, the thermal oxidation processes have the major limitation of a high thermal budget (high temperature/long oxidation time), which is not suitable for low-temperature devices. Additionally, the thermal oxidation process has a low oxidation efficiency due to the molecular state of the oxygen species, and often results in undesirable interactions, such as diffusion, among various layers in the devices. Rapid thermal oxidation processes also show poor oxidation efficiency, especially at film thicknesses greater than 100 Å, and the thermal budget is not suitable for low-temperature (<600° C.) devices integrated on glass, plastic, polymer, or other low temperature substrates.

Plasma oxidation processes have a lower thermal budget and the higher efficiency than thermal processes. However, the oxide formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Additionally, the low plasma density associated with these types of sources ($\sim 10^8$-$10^9$ cm$^{-3}$) leads to inefficient oxidation and impurity reduction at low thermal budgets, which limits their usefulness in the fabrication of low-temperature electronic devices.

Other approaches such as radical oxidation, photo oxidation, and ozone oxidation, have been taken to improve the oxidation efficiency, by the creation of an active oxygen species. However, the process complexity, plasma density, nature and life-time of active species, low efficiency, high thermal budgets, and large area processing limit the applicability of these approaches to low-temperature and high-throughput device fabrication.

SUMMARY OF THE INVENTION

The present invention provides a high-density oxygen plasma process to address the issues of low-temperature and low thermal budget oxidation, impurity reduction, and plasma-induced structural damage in oxide thin films. High-density plasma (HDP) is characterized by a high plasma concentration, low plasma potential, and independent control of plasma energy and density. The HDP process is effective in the creation of active oxygen species, which can diffuse through the oxide thin film lattice at thermal budgets significantly lower than the thermal, radical, or capacitively-coupled plasma oxidation processes. The low plasma potential of the HDP process minimizes any plasma-induced bulk or interfacial damage. Additionally, the ion bombardment energy can be effectively controlled in the HDP oxidation process, further enhancing the oxidation and impurity reduction (C or other impurities) efficiency at low thermal budgets.

Accordingly, a method is provided for additionally oxidizing a thin-film oxide. The method comprises: providing a substrate; depositing an MyOx (M oxide) layer overlying the substrate, where M is a solid element having an oxidation state in a range of +2 to +5; treating the MyOx layer to a HDP source; forming an MyOk layer in response to the HDP source, where k>x.

In one aspect, the method further comprises decreasing the concentration of oxide charge in response to forming the MyOk layer. In another aspect, the MyOx layer is deposited with an impurity N, and the method further comprises creating volatile N oxides in response to forming the MyOk layer. For example, the impurity N may be carbon and the method creates a volatile carbon oxide.

In another aspect, an (M1, M2, ... )Ox layer is deposited, where each M is a solid element with an oxidation state in the range of +1 to +6. Then, the method forms an (M1, M2, ... )Ok layer in response to the HDP source, where k>x.

In one aspect, the HDP source is an inductively coupled plasma (ICP) source. More generally, the only limitation on the HDP source is that at least one electrode be powered with a source having an operating frequency of greater than about 13.56 megahertz (MHz). For example, a microwave slot antenna, a hollow cathode, an electron cyclotron resonance (ECR) plasma source, or a cathode-coupled HD plasma source can be used.

Additional details of the above-described method are presented below.

BRIEF DESCRIPTION OF THE DRAWINGS

FIG. 10 is a flowchart illustrating a variation on the method for additionally oxidizing a thin-film oxide.

FIG. 11 is a flowchart illustrating a second variation on a method for additionally oxidizing a thin-film oxide.

DETAILED DESCRIPTION

The present invention describes a HDP oxidation process to enhance the electrical performance and reliability of single or multi-component oxide thin films. The HDP oxidation process provides a low temperature and low thermal budget solution, to improve the oxidation state and reduce impurity levels in oxide thin films. The HDP process offers the significant advantages of high plasma density, low plasma potential, and independent control of plasma energy and density. The high plasma density and the energy state of the plasma generated oxygen species are effective in minimizing the thermal budget for oxidation, while the low plasma potential minimizes any plasma-induced bulk or interfacial damage. The independent control of plasma energy and density are suitable for minimizing the thermal budget, and reducing levels of C or other impurities, by controlling the energy of the bombarding oxygen or other plasma species.

For example, the HDP oxidation process may be used to reduce the C contamination and improve the electrical performance of 15-100 nanometer (nm) thick TEOS oxide films, at a process temperature of 300° C. The HDP oxidation process also significantly enhances the electrical performance of silane oxide films deposited at a process temperature of 150° C. The observed effects of the HDP oxidation on the oxide thin film performance show the potential of the HDP oxidation process in improving the oxidation state and reducing the impurity levels in thin oxide films for the fabrication of stable and reliable microelectronic devices integrated on both low and high temperature substrates.

Figure 1:
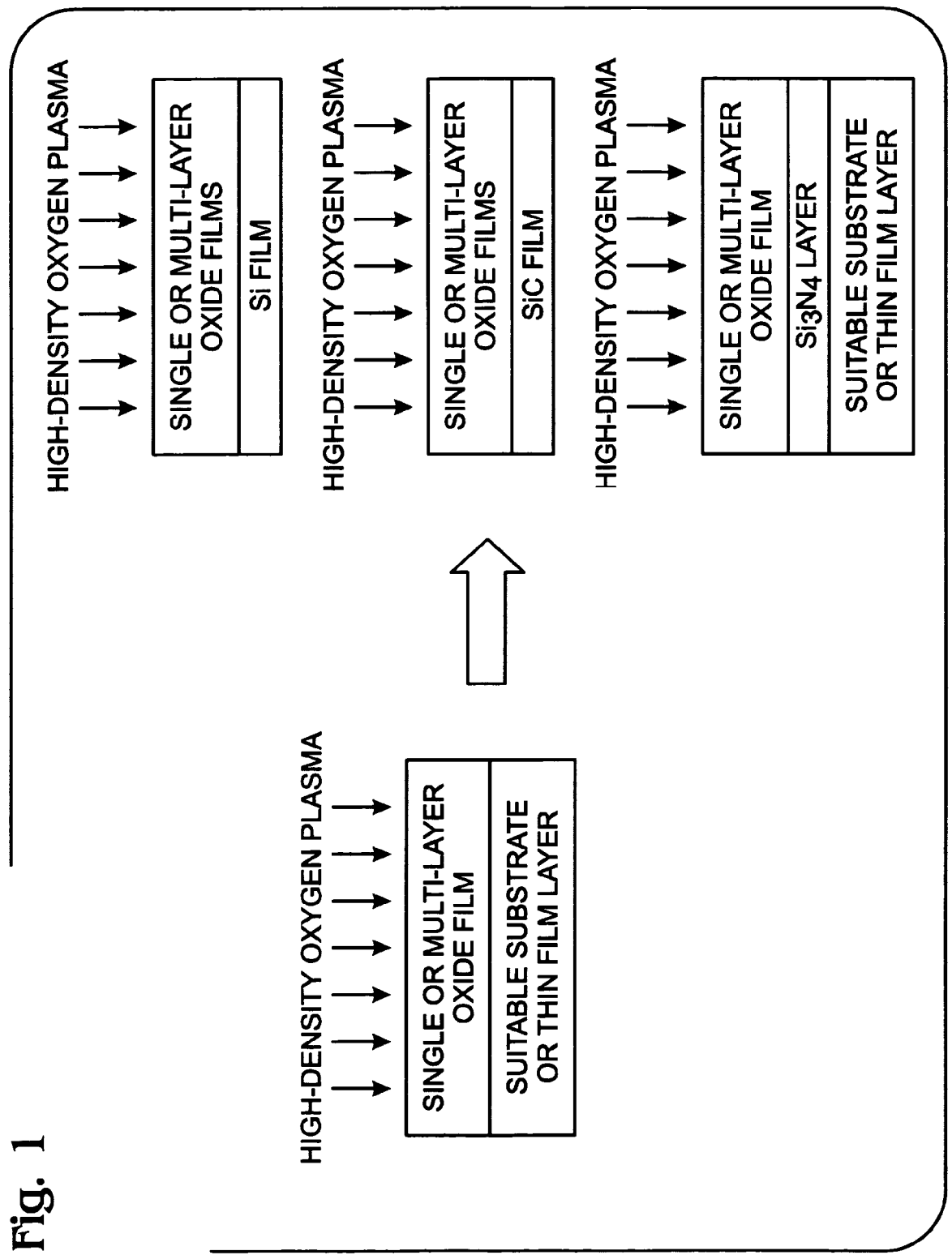
FIG. 1 depicts partial cross-sectional views of some typical thin-film oxide configurations, which can be treated by HDP oxygen plasma.

FIG. 1 depicts partial cross-sectional views of some typical thin-film oxide configurations, which can be treated by HDP oxygen plasma. As noted above, the HDP process improves the oxidation state, and reduces the system, substrate, or process-induced impurities. A single or multi-component oxide film can be formed into either a single layer or multi-layer stack. The HDP oxidation process is suitable for both low and high-temperature electronic devices integrated on plastic, glass, ceramic, metal, and semiconductor substrates.

The details of the high-density plasma system configuration and the processing range are described in the following sections. A proof of concept was established by using the HDP oxidation process to minimize C impurities in low-temperature deposited 1000 Å-thick TEOS oxide films. The HDP oxidation process also improves the electrical performance of 15-100 nm thick films. The efficiency of the HDP oxidation process was also established at a low temperature of 150° C., by analyzing its effects on the electrical characteristics of silane oxide films.

High-Density Plasma System

Figure 2:
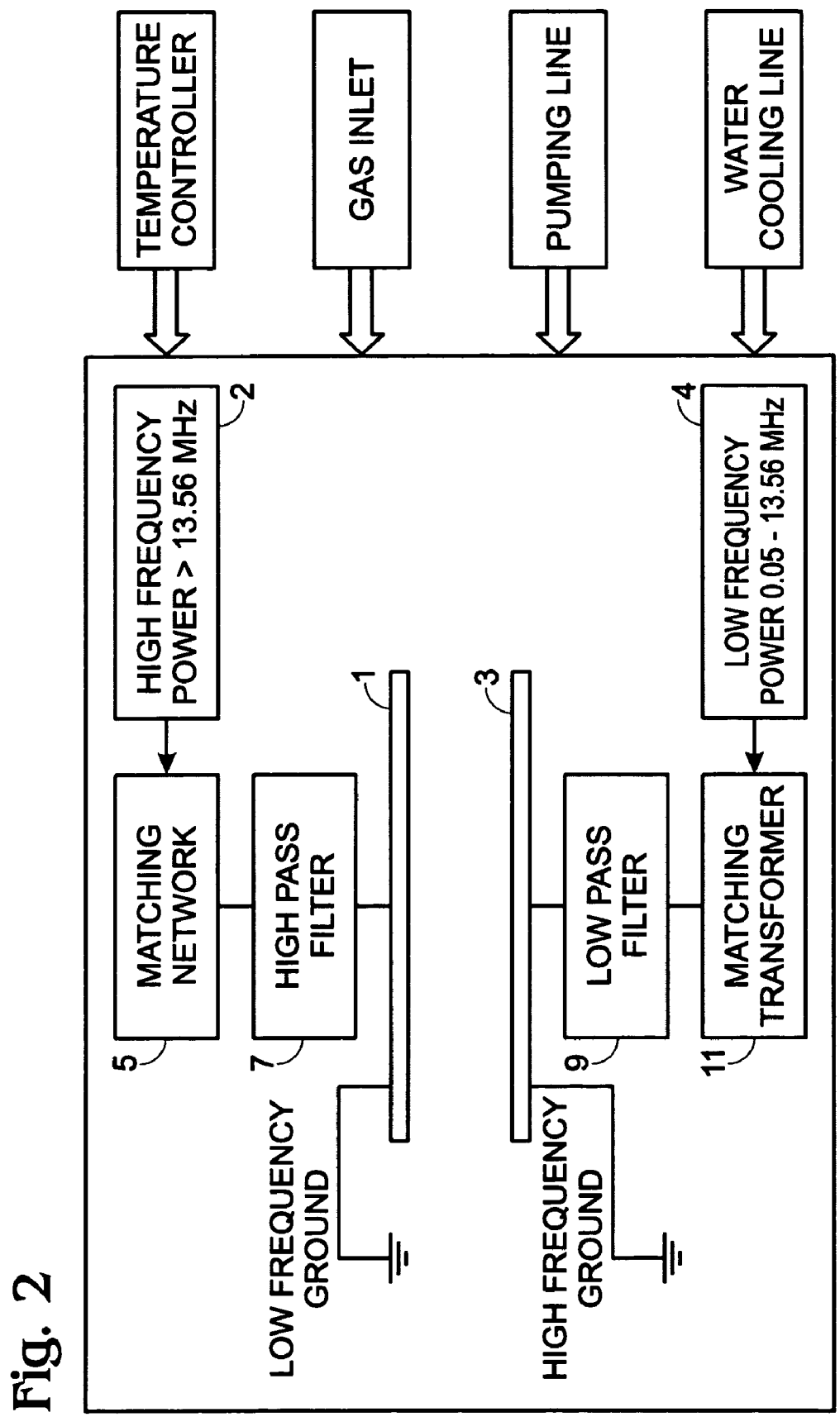
FIG. 2 is a schematic drawing of a high-density plasma (HDP) system with an inductively-coupled plasma source.

FIG. 2 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), while the bottom electrode power can be as great as about 3 W/cm$^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is the floating type of potential, dependent on the system design and the nature of the power coupling.

The HDP tool is a true high density plasma process with an electron concentration of greater than $1\times10^{11}$ cm$^{-3}$, and the electron temperature is less than 10 eV. There is no need to maintain a bias differential between the capacitor connected to the top electrode and the system body, as in many conventional designs such as capacitively-coupled plasma tools. Alternately stated, both the top and bottom electrodes receive RF and low frequency (LF) powers.

High-Density Plasma Oxidation Process

The high-density plasma oxidation process described in this invention has been successfully used for the low-temperature oxidation of Si films. Further, a high-density plasma growth process, with high SiO$_2$ growth rates at temperatures lower than 400° C., can be used where conventional thermal growth is impractical. The plasma-grown SiO$_2$ thin-films (grown at 300° C.) have a high quality, comparable to thermal oxides grown at temperatures of higher than 800° C.

Figure 3:
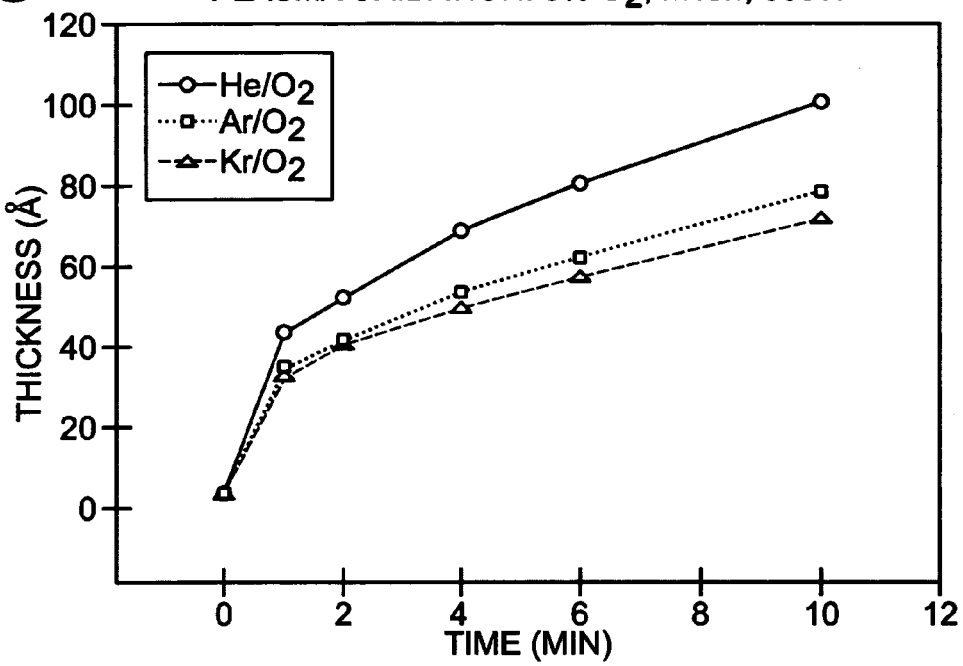
FIG. 3 is a graph depicting some exemplary high-density plasma growth rates in various inert gas/$O_2$ atmospheres.

FIG. 3 is a graph depicting some exemplary high-density plasma growth rates in various inert gas/O$_2$ atmospheres. The high-density plasma process is effective in growing SiO$_2$ thin-films at temperatures lower than 400° C., at rates significantly higher than the thermal oxide rates, which are impractical below 800° C. As shown, it is possible to obtain a growth rate of 100 Å/min after a deposition time of 10 min in He/O$_2$ atmosphere. The high-density plasma growth rates can be sustained down to an investigated temperature of about 150° C.

The observed results on the low-temperature growth of the oxide films on Si, at temperatures where the thermal growth is impractical, suggests that the active state of the high-density plasma generated oxygen species can effectively diffuse through the growing oxide film irrespective of the thermal state of the substrate, as observed in the investigated temperature range of 150-350° C. The same active oxygen species can be exploited to minimize the C impurities, and enhance electrical performance of TEOS oxide thin films deposited at low temperatures in the range of 250-400° C. The low-temperature efficiency of HDP oxidation was also analyzed by investigating the properties of silane oxide films, deposited at a temperature of 150° C., before and after oxidation treatment at 150° C. The details of the process conditions and range for the high-density plasma growth process are listed in Table I.

TABLE 1

High-density plasma oxidation processes for post-deposition oxidation treatment of oxide thin-films.

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Oxidation Time | 0-60 min |
| Gases | O$_2$/Inert Gas, O$_2$: 0-20% |
| Temperature | 25-400° C. |

Carbon Impurity Reduction

Low-temperature TEOS oxide films with enhanced step coverage are desired for 3D device development. However, the low-temperature deposition process required for good step coverage leads to higher C impurities in the deposited films, which in turn, results in serious stability and reliability issues. The present invention HDP oxidation process can be used to reduce the C impurities in low-temperature TEOS oxide films, to enhance the electrical quality and reliability. The HDP oxidation also improves the oxidation state and minimizes oxygen vacancies in the TEOS oxide films. The details of the HDP oxidation process are listed in Table II.

Figure 4:
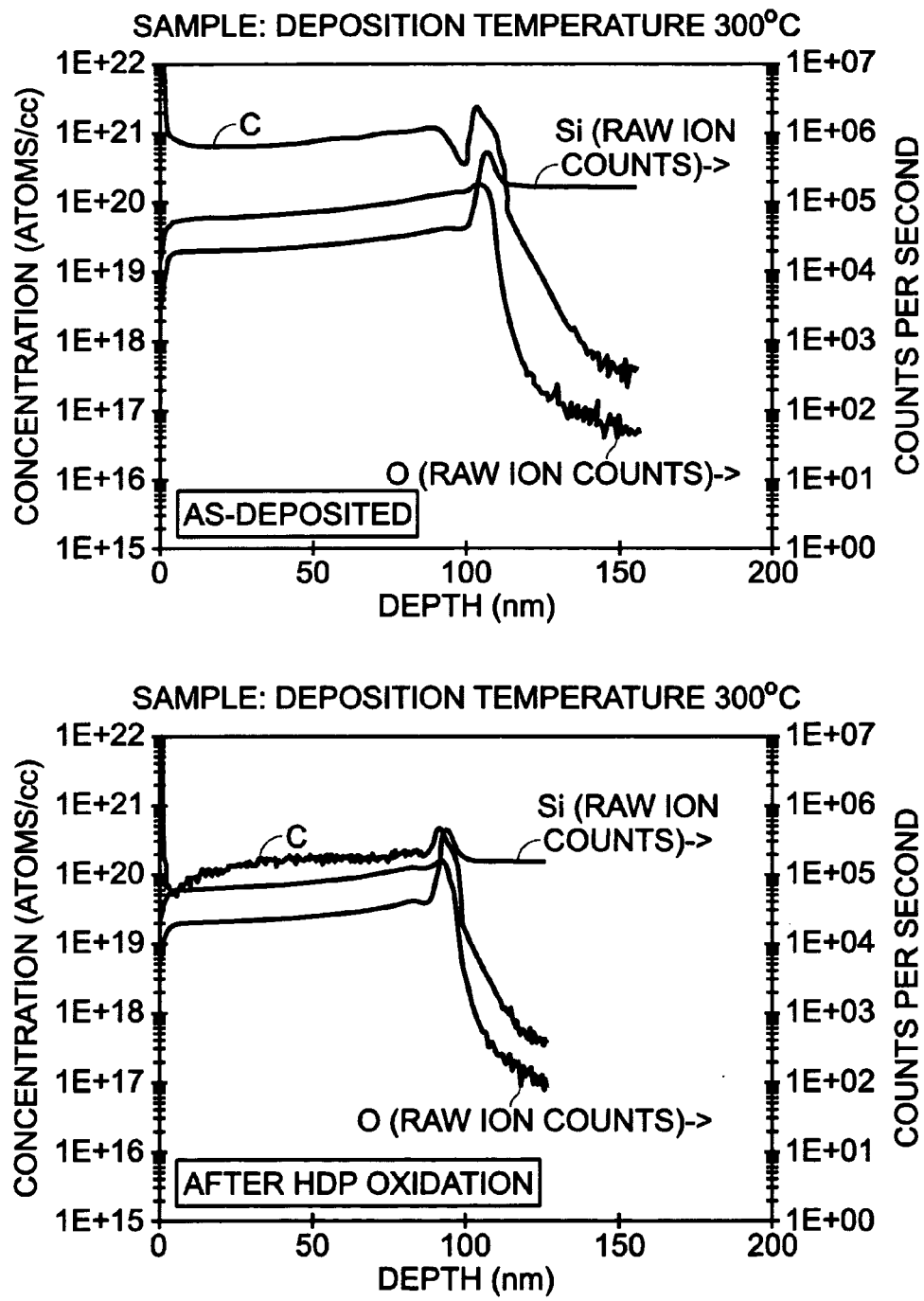
FIG. 4 shows two graphs, depicting the effect of the HDP oxidation on the C content in TEOS oxide films deposited at 300° C.

FIG. 4 shows two graphs, depicting the effect of the HDP oxidation on the C content in TEOS oxide films deposited at 300° C. Tetraethylorthosilicate (TEOS) oxide films having a thickness of 1000 Å were investigated. The C concentration was found to decrease by an order of magnitude in response to an HDP oxidation treatment at a temperature of 300° C. The thermal budget for plasma oxidation is a strong function of films thickness. The efficiency of the C impurity reduction is significantly higher in oxide thin-films with lower concentrations of C, or with thinner oxide films having a lower total carbon content.

TABLE II

High-density plasma oxidation process for post-deposition oxidation treatment of oxide thin films.

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Oxidation Time | 0-60 min |
| Gases | Any suitable source of oxygen |
| Gases | O$_2$/Inert Gas, O$_2$: 0-20% |
| Temperature | 25-400° C. |

HDP Oxidation Effects on TEOS Oxide Film Electrical Quality

Figure 5:
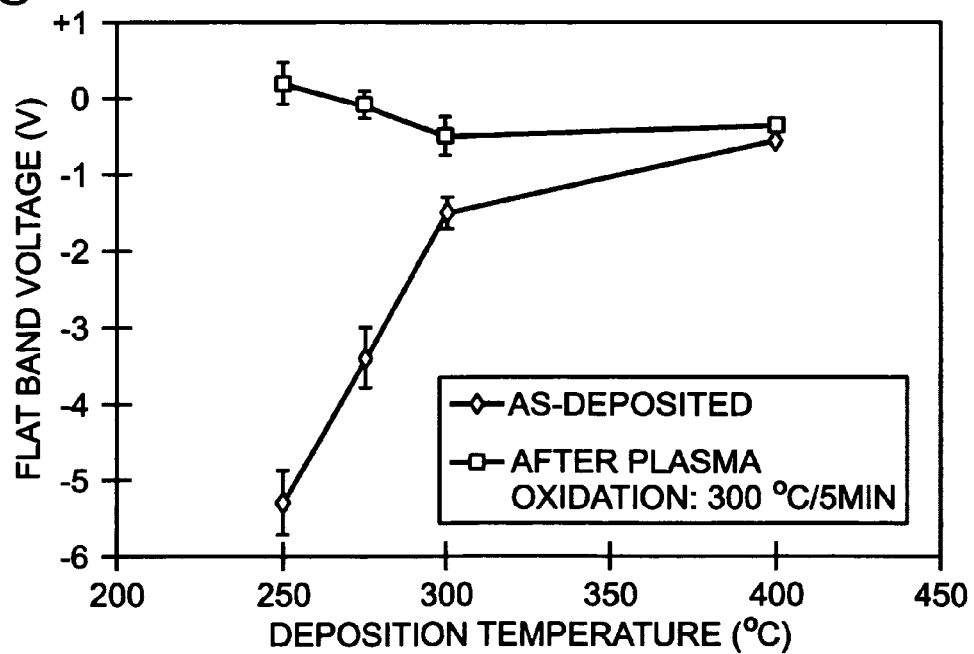
FIG. 5. is a graph depicting the effects of TEOS oxide deposition temperature and HDP oxidation treatment upon flat-band voltage.

FIG. 5. is a graph depicting the effects of TEOS oxide deposition temperature and HDP oxidation treatment upon flat-band voltage. The TEOS oxide films were deposited in the temperature range of 250-400° C. As shown, the flat-band voltage of the films improves significantly after an HDP oxidation treatment at 300° C., for 5 minutes. The observed results indicate that the HDP-generated active oxygen species are able to improve the oxidation across the film thickness and at the $SiO_2/Si$ interface.

Figure 6:
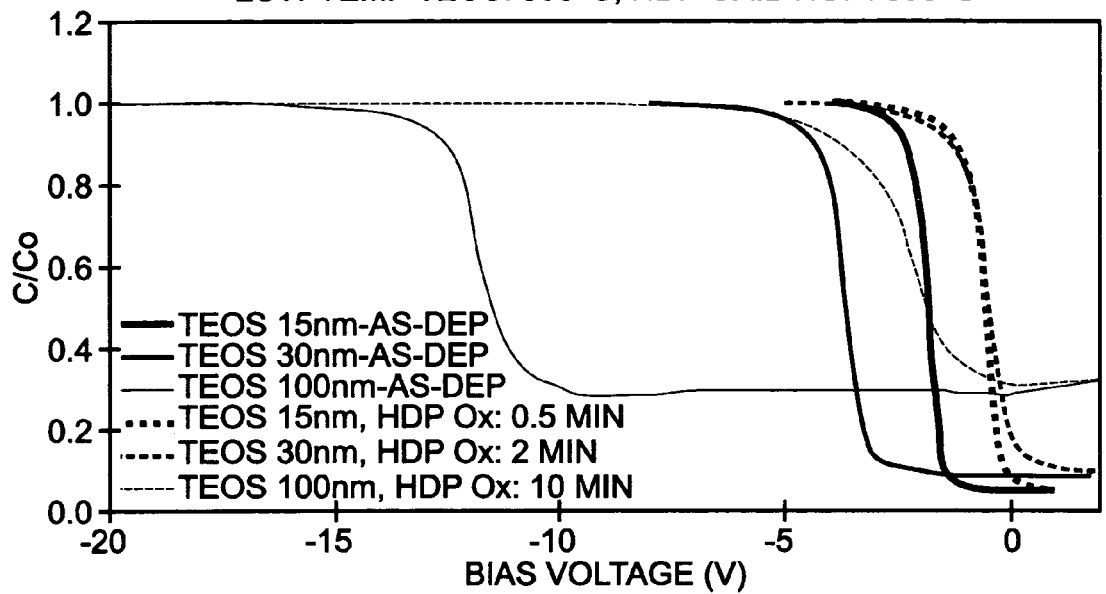
FIG. 6. is a graph of C-V curves showing the relationship between HDP oxidation time and TEOS oxide film thickness.

FIG. 6. is a graph of C-V curves showing the relationship between HDP oxidation time and TEOS oxide film thickness. Oxide film quality was analyzed from the perspective of the oxidation time necessary to improve the electrical quality of TEOS oxide films deposited at a temperature of 300° C. The HDP oxidation time required to improve the C-V characteristics was found to be strongly dependent on the film thickness. The optimum oxidation time decreases with film thickness, as shown, indicating that the HDP oxidation efficiency is dependent on the impurity content and thickness of the deposited films, and not limited by the concentration and energy state of the impinging oxygen radicals.

HDP Oxidation Effects on Silane Oxide Films Processed at 150° C.

Figure 7:
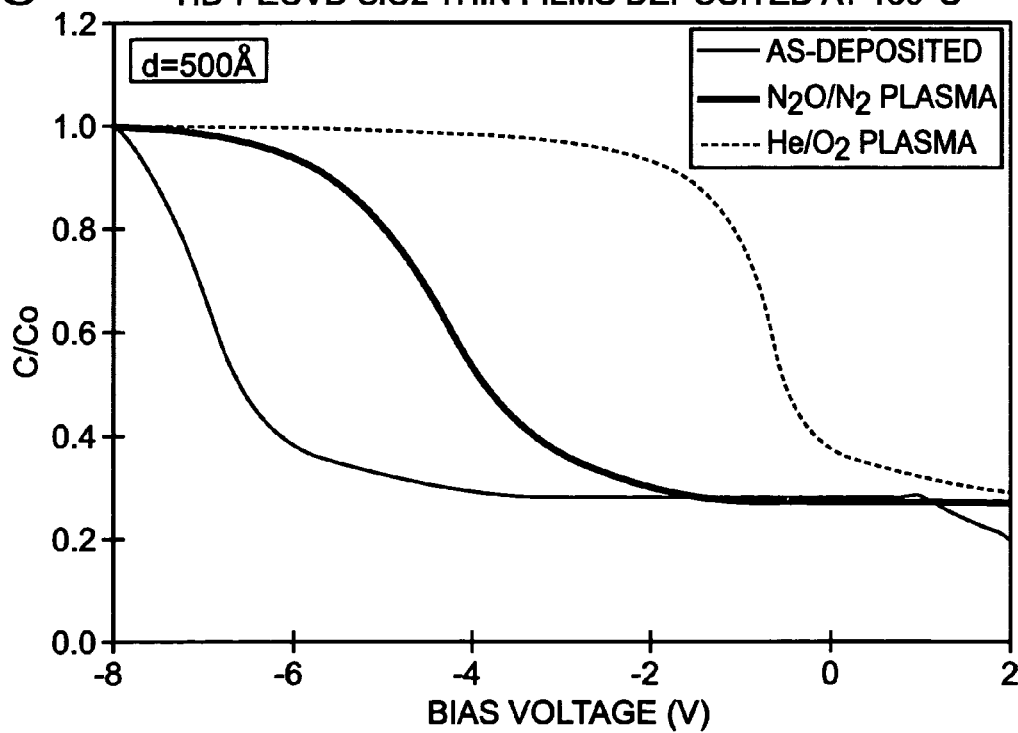
FIG. 7 is a graph depicting the effect of low-temperature (150° C.) HDP oxidation treatment on silane oxide films deposited at 150° C.

FIG. 7 is a graph depicting the effect of low-temperature (150° C.) HDP oxidation treatment on silane oxide films deposited at 150° C. The properties of the as-deposited silane oxide films were found to be poor at a low-deposition temperature of 150° C. The HDP oxidation treatment was carried out at a temperature of 150° C. to improve the electrical performance of the silane oxide films. As shown, the flat-band voltage of the silane oxide films improves significantly after the HDP oxidation treatment, as reflected in the lower flat-band voltage. The observed improvement in the electrical characteristics of the silane oxide films shows the potential of the HDP oxidation process in addressing the issues of gate oxide quality and reliability at low thermal budgets, even for low-temperature electronic devices integrated on glass, plastic, or other polymeric substrates.

Figure 8:
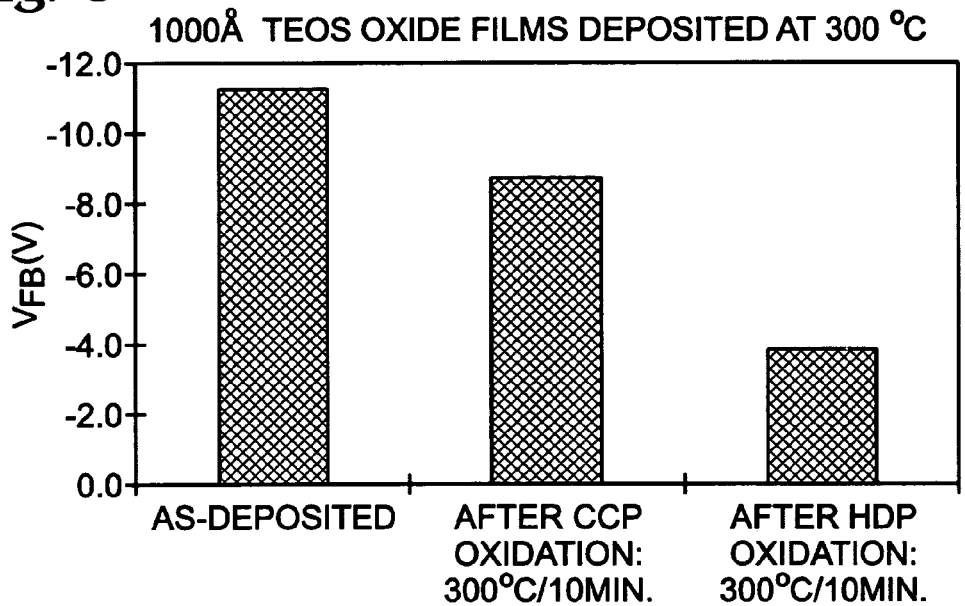
FIG. 8 is a graph comparing the effects of ICP and CCP-generated oxygen plasma treatment on the flat-band voltage of 1000 Å-thick TEOS oxide films deposited at 300° C.

Comparison of Capacitively and Inductively Coupled Plasma (ICP) Oxidation Process-Efficiencies FIG. 8 is a graph comparing the effects of ICP and CCP-generated oxygen plasma treatment on the flat-band voltage of 1000 Å-thick TEOS oxide films deposited at 300° C. The TEOS oxide films were exposed to ICP and CCP-generated oxygen plasma at 300° C., for 10 minutes. As shown, the C-V characteristics of 1000 Å-thick films significantly improve using HDP oxygen plasma, as compared to CCP oxygen plasma. This comparison shows the effectiveness of the HDP process in generating a high concentration of active oxygen radicals as compared to CCP oxygen plasma, which is dominantly controlled by atomic or molecular oxygen ions. The HDP oxygen plasma process is also preferable to CCP plasma process in terms of minimizing bulk and interfacial damage in the oxide thin films by the impinging ionic species. The reduction in damage is especially significant at smaller film thicknesses, due to significantly lower plasma potential, greater control of plasma energy, and a narrower ion energy distribution with no tail extension into the high energy region.

Figure 9:
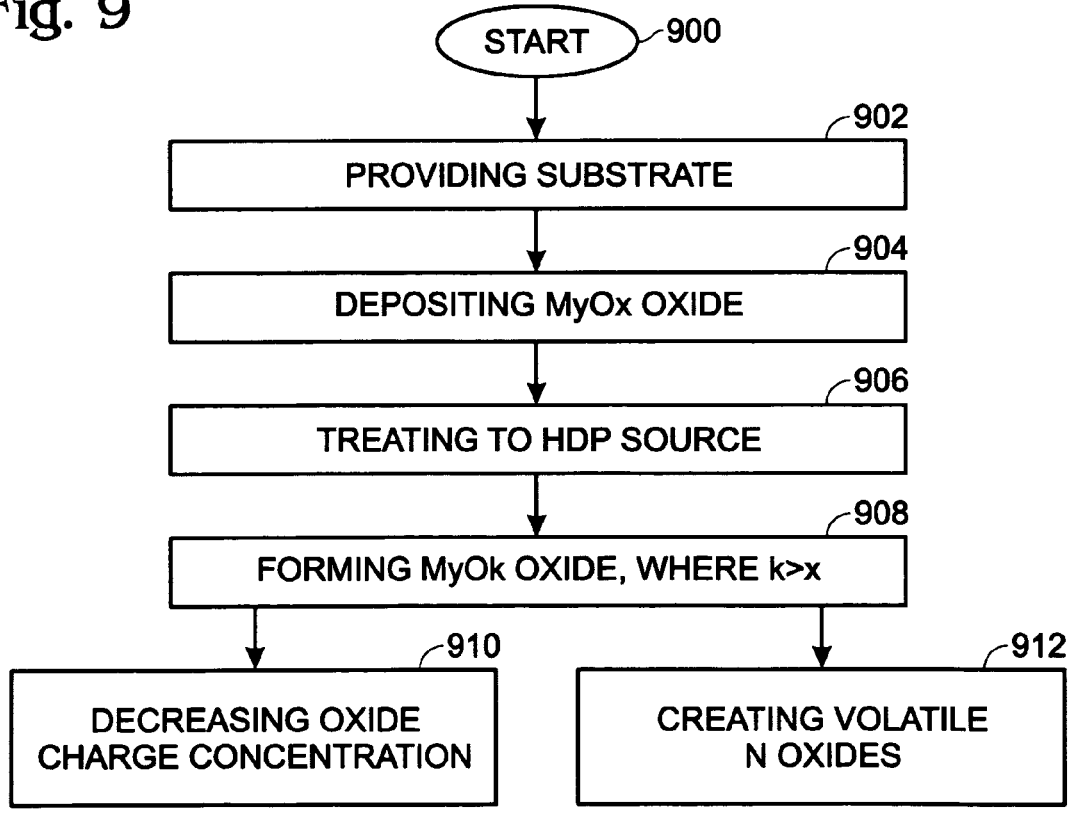
FIG. 9 is a flowchart illustrating a method for additionally oxidizing a thin-film oxide.

FIG. 9 is a flowchart illustrating a method for additionally oxidizing a thin-film oxide. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a substrate. Typically, the substrate is plastic, glass, quartz, ceramic, metal, a semiconductor material, or a polymer. Step 904 deposits an MyOx (M oxide) layer overlying the substrate, where M is a solid element, such as Si. Other examples of M (binary) oxides include $Al_2O_3$, $Ta_2O_5$, $HfO_2$, $Y2O3$, $ZrO2$, $TiO2$, $HfO2$, $Nb2O5$, $Ta2O5$, $ZnO$, $Al2O3$, $SiO2$, and $SnO2$. Step 906 treats the MyOx layer to a HDP source. Step 908 forms an MyOk layer in response to the HDP source, where k>x. In a simple example, Step 904 deposits SiOx, and Step 908 forms $SiO_2$.

In one aspect, Step 906 treats the MyOx layer to an inductively coupled plasma (ICP) source. Alternately, Step 906 can be enabled using any HDP source that has at least one electrode powered by a source with an operating frequency of greater than about 13.56 MHz. For example, the HDP source can be a microwave slot antenna, a hollow cathode, an electron cyclotron resonance (ECR) plasma source, or a cathode-coupled plasma source.

Although the process is not limited to any particular temperature, the treatment of the MyOx layer in Step 906 has been found to be effective even when the substrate is heated to a temperature of less than about 400° C. For example, if Step 902 forms a substrate from a temperature-sensitive material such as plastic, Step 906 may treat the MyOx layer to a HDP source by heating the substrate to a temperature of less than about 200° C.

In one aspect, Step 906 treats the MyOx layer using an ICP source as follows:

supplying power to a top electrode at a frequency in the range of 13.56 to 300 megahertz (MHz), and a power density of up to 10 watts per square centimeter ($W/cm^2$);

supplying power to a bottom electrode at a frequency in the range of 50 kilohertz to 13.56 MHz, and a power density of up to 3 $W/cm^2$;

using an atmosphere pressure in the range of 1 to 500 mTorr; and, supplying an oxygen gas.

The oxygen gas can be a mixture of $O_2$ and an insert gas, in a ratio in the range of 0 to 20%. For example, the inert gas can be He, Ar, or Kr. Typically, the oxidization occurs for a duration in the range of 1 to 60 minutes. In another aspect, the oxygen gas source can be $N_2O$, $O_2$, or $O_3$.

In one aspect, depositing an MyOx layer in Step 904 includes depositing an MyOx layer where M has an oxidation state in a range of +2 to +5. Alternately, a multi-component oxide is treated. That is, Step 904 deposits an (M1, M2, ...)Ox layer, where each M element has an oxidation state in the range of +1 to +6. Some examples of multi-component oxides include $Si_xGe_{1-x}O_2$, aluminates and silicatyes of Hf and Zr, (1-x)Ta2O5-xAl2O3, SiOxN(1-x), (1-x)Ta2O4-xNb2O5. In general, multi-component oxides are the various solid solution oxides of elements with the oxidation state from 1-6. Then, Step 908 forms an (M1, M2, ...)Ok layer in response to the HDP source, where k>x.

In another aspect a further step, Step 910, decreases the concentration of oxide charge in response to forming the MyOk layer.

In a different aspect, Step 904 deposits an MyOx layer with an impurity N. Step 912 creating volatile N oxides in response to forming the MyOk layer. For example, if the impurity N is carbon, Step 912 creates volatile carbon oxides (COx, where x is in the range of 1 to 2).

FIG. 10 is a flowchart illustrating a variation on the method for additionally oxidizing a thin-film oxide. The method starts at Step 1000. Step 1002 provides a substrate. Step 1004 deposits a multi-component oxide layer ($M1_{y1}, M2_{y2}, \ldots$)Ox overlying the substrate, where each M is a solid element with an oxidation state in a range of +1 to +6. In some aspects, the oxide only includes a single M element. That is, $y_1 > 0$ and $y_2, \ldots$ all equal 0. Step 1006 treats the ($M1_{y1}, M2_{y2}, \ldots$)Ox layer to a high density plasma (HDP) source. Step 1008 forms an ($M1_{y1}, M2_{y2}, \ldots$)Ok layer in response to the HDP source, where k>x. In one aspect, ($M2_{y2}, \ldots$)=0. That is, $M1_{y1}Ox$ is deposited in Step 1004, and $M1_{y1}Ok$ is formed in Step 1008

In one aspect, Step 1006 treats the ($M1_{y1}, M2_{y2}, \ldots$)Ox layer by heating the substrate to a temperature of less than about 400° C. In another aspect, Step 1006 treats the ($M1_{y1}, M2_{y2}, \ldots$)Ox layer using a HDP source having an operating frequency greater than 13.56 MHz.

In one aspect, Step 1010 decreases the concentration of oxide charge in response to forming the ($M1_{y1}, M2_{y2}, \ldots$)Ok layer.

In another aspect, Step 1004 deposits an ($M1_{y1}, M2_{y2}, \ldots$)Ox layer with an impurity N, and Step 1012 creates volatile N oxides in response to forming the ($M1_{y1}, M2_{y2}, \ldots$)Ok layer.

FIG. 11 is a flowchart illustrating a second variation on a method for additionally oxidizing a thin-film oxide. The method starts at Step 1100. Step 1102 provides a substrate. Step 1104 deposits a multi-component oxide layer ($M1_{y1}, M2_{y2}, \ldots$)Ox overlying the substrate, with an impurity N, where each M is a solid element having an oxidation state in a range of +1 to +6. In some aspects, the oxide only includes a single M element. That is, $y_1 > 0$ and $y_2, \ldots$ all equal 0. Step 1106 treats the ($M1_{y1}, M2_{y2}, \ldots$)Ox layer to a high density plasma (HDP) source. Step 1108 creates volatile N oxides. If carbon impurities are deposited in Step 1104, then Step 1108 creates carbon oxides.

A high-density plasma oxidation method has been provided for improving the characteristics of as-deposited oxide thin-films. Some details of specific materials and fabrication steps have been used to illustrate the invention. However, the invention is not limited to merely these examples. Other variations and embodiments of the invention will occur to those skilled in the art.

We claim:

1. A method for additionally oxidizing a thin-film oxide, the method comprising:
   providing a substrate;
   depositing an MyOx (M oxide) layer overlying the substrate, where M is a solid element;
   treating the MyOx layer to an inductively coupled plasma (ICP) high-density plasma (HDP) source as follows:
      supplying power to a top electrode at a frequency in the range of 13.56 to 300 megahertz (MHz), and a power density of up to 10 watts per square centimeter ($W/cm^2$);
      supplying power to a bottom electrode at a frequency in the range of 50 kilohertz to 13.56 MHz, and a power density of up to 3 $W/cm^2$;
      using an atmosphere pressure in the range of 1 to 500 mTorr; and
      supplying an oxygen gas; and,
   forming an MyOk layer in response to the ICP HDP source, where k>x.

2. The method of claim 1 wherein treating the MyOx layer to the ICP HDP source includes heating the substrate to a temperature of less than about 400° C.

3. The method of claim 1 wherein supplying an oxygen gas includes:
   mixing O2 and an insert gas in a ratio in the range of 0 to 20%;
   using an inert gas selected from the group including He, Ar, and Kr; and
   the method further comprising:
   oxidizing for a duration in the range of 1 to 60 minutes.

4. The method of claim 1 wherein supplying an oxygen gas includes supplying oxygen gas from a source selected from the group including N2O, O2, and O3.

5. The method of claim 1 further comprising:
   in response to forming the MyOk layer, decreasing the concentration of oxide charge.

6. The method of claim 1 wherein depositing an MyOx layer includes depositing an (M1, M2, . . . )Ox layer, where each M element has an oxidation state in the range of +1 to +6; and,
   wherein forming the MyOk layer includes forming an (M1, M2, . . . )Ok layer in response to the ICP HDP source, where k>x.

7. The method of claim 1 wherein depositing the MyOx layer overlying the substrate includes depositing an MyOx layer with an impurity N; and,
   the method further comprising:
   in response to forming the MyOk layer, creating volatile N oxides.

8. The method of claim 1 wherein forming the substrate includes forming a substrate from a material selected from the group consisting of plastic, glass, quartz, ceramic, metal, polymer, and semiconductor materials.

9. The method of claim 1 wherein forming the substrate includes forming a substrate from a plastic material; and,
   wherein treating the MyOx layer to an ICP source includes heating the substrate to a temperature of less than about 200° C.

10. The method of claim 1 wherein depositing an MyOx layer includes depositing an MyOx layer where M has an oxidation state in a range of +2 to +5.

11. The method of claim 7 wherein depositing the MyOx layer with the impurity N includes depositing an MyOx layer with carbon impurities; and,
    wherein creating volatile N oxides includes creating carbon oxides.

* * * * *